United States Patent
Rice

(10) Patent No.: US 7,720,655 B2
(45) Date of Patent: May 18, 2010

(54) EXTENDED MAINFRAME DESIGNS FOR SEMICONDUCTOR DEVICE MANUFACTURING EQUIPMENT

(75) Inventor: Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 651 days.

(21) Appl. No.: 11/613,559

(22) Filed: Dec. 20, 2006

(65) Prior Publication Data

US 2007/0141748 A1 Jun. 21, 2007

Related U.S. Application Data

(60) Provisional application No. 60/752,459, filed on Dec. 20, 2005.

(51) Int. Cl.
*G06F 17/50* (2006.01)
*H01L 21/00* (2006.01)

(52) U.S. Cl. ............. 703/2; 700/23; 700/213; 700/218; 414/744.2

(58) Field of Classification Search ............ 700/23, 700/218, 213; 703/2, 23; 414/744, 744.2
See application file for complete search history.

(56) References Cited

U.S. PATENT DOCUMENTS

| | | | |
|---|---|---|---|
| 5,551,013 A * | 8/1996 | Beausoleil et al. ............ 703/23 |
| 5,951,770 A | 9/1999 | Perlov et al. | |
| 6,287,386 B1 | 9/2001 | Perlov et al. | |
| 6,468,353 B1 | 10/2002 | Perlov et al. | |
| 6,486,444 B1 | 11/2002 | Fairbairn et al. | |
| 6,575,737 B1 | 6/2003 | Perlov et al. | |
| 6,916,397 B2 | 7/2005 | Pfeiffer et al. | |
| 2002/0021959 A1 * | 2/2002 | Schauer et al. ........... 414/744.2 |
| 2002/0157691 A1 | 10/2002 | Wada | |
| 2002/0170672 A1 | 11/2002 | Perlov et al. | |
| 2003/0060922 A1 * | 3/2003 | Schauer et al. ............ 700/213 |
| 2003/0083776 A1 * | 5/2003 | Schauer et al. ............ 700/218 |
| 2003/0212539 A1 * | 11/2003 | Beausoleil et al. ............ 703/25 |
| 2004/0007325 A1 | 1/2004 | Pan et al. | |

(Continued)

FOREIGN PATENT DOCUMENTS

CN 1365519 8/2002

OTHER PUBLICATIONS

International Preliminary Report on Patentability of International Application No. PCT/US06/048695 mailed Jul. 3, 2008.
International Search Report and Written Opinion of International Application No. PCT/US06/48695 mailed Sep. 25, 2007.
Office Action of Chinese Application No. 200680048123.6 dated Jul. 3, 2009.

*Primary Examiner*—Thai Phan
(74) *Attorney, Agent, or Firm*—Dugan & Dugan

(57) ABSTRACT

In a first aspect, a first mainframe is provided for use during semiconductor device manufacturing. The first mainframe includes (1) a sidewall that defines a central transfer region adapted to house a robot; (2) a plurality of facets formed on the sidewall, each adapted to couple to a process chamber; and (3) an extended facet formed on the sidewall that allows the mainframe to be coupled to at least four full-sized process chambers while providing service access to the mainframe. Numerous other aspects are provided.

22 Claims, 9 Drawing Sheets

U.S. PATENT DOCUMENTS

| | | |
|---|---|---|
| 2004/0020601 A1 | 2/2004 | Zhao et al. |
| 2004/0206621 A1 | 10/2004 | Li et al. |
| 2005/0072716 A1 | 4/2005 | Quiles et al. |
| 2005/0223837 A1 | 10/2005 | van der Meulen |
| 2006/0246683 A1 | 11/2006 | Pan et al. |
| 2009/0108544 A1 | 4/2009 | Sico et al. |

* cited by examiner

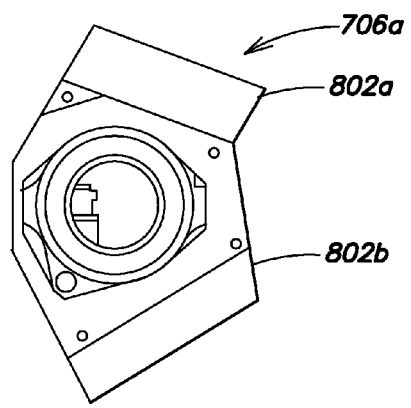 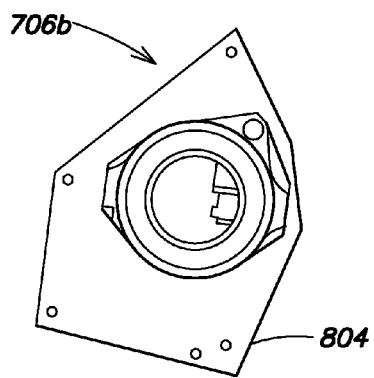
FIG. 8A   FIG. 8B
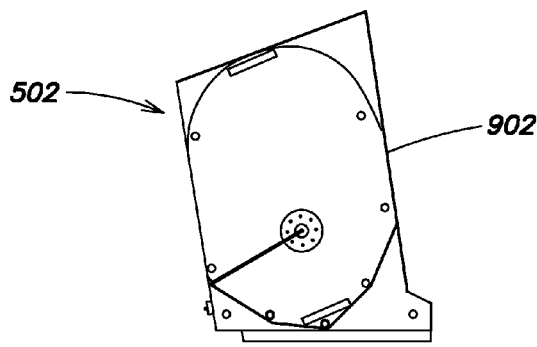
FIG. 9

EXTENDED MAINFRAME DESIGNS FOR SEMICONDUCTOR DEVICE MANUFACTURING EQUIPMENT

The present application claims priority to U.S. Provisional Patent Application Ser. No. 60/752,459, filed Dec. 20, 2005 and entitled "EXTENDED MAINFRAME DESIGNS FOR SEMICONDUCTOR DEVICE MANUFACTURING EQUIPMENT," which is hereby incorporated herein by reference in its entirety for all purposes.

FIELD OF THE INVENTION

The present invention relates to semiconductor device manufacturing, and more particularly to extended mainframe designs for semiconductor device manufacturing equipment.

BACKGROUND OF THE INVENTION

Semiconductor device manufacturing processes often are performed with tools having mainframes in which multiple processing chambers and/or load lock chambers are coupled around a central transfer chamber. The processing chambers may each perform unique processes, or in many instances, may perform redundant and/or related processes.

To ensure proper operation of a semiconductor device manufacturing tool, processing, load lock and other chambers of the tool must be maintained. Sufficient access to maintain the chambers is required. However, in some cases, providing such access may limit system throughput.

SUMMARY OF THE INVENTION

In a first aspect of the invention, a first mainframe is provided for use during semiconductor device manufacturing. The first mainframe includes (1) a sidewall that defines a central transfer region adapted to house a robot; (2) a plurality of facets formed on the sidewall, each adapted to couple to a process chamber; and (3) an extended facet formed on the sidewall that allows the mainframe to be coupled to at least four full-sized process chambers while providing service access to the mainframe.

In a second aspect of the invention, a system is provided for use during semiconductor device manufacturing. The system includes a mainframe having (1) a sidewall that defines a central transfer region adapted to house a robot; (2) a plurality of facets formed on the sidewall, each adapted to couple to a process chamber; and (3) an extended facet formed on the sidewall that allows the mainframe to be coupled to at least four full-sized process chambers while providing service access to the mainframe. The system also includes (a) a robot positioned within the central transfer region of the mainframe; (b) a load lock chamber coupled to a first of the plurality of facets; and (c) a process chamber coupled to the extended facet. The extended facet is adapted to increase a distance between the load lock chamber coupled to the mainframe and the process chamber coupled to the extended facet.

In a third aspect of the invention, a second mainframe is provided for use during semiconductor device manufacturing. The second mainframe includes a first transfer section having (1) a first sidewall that defines a first central transfer region adapted to house a first robot; (2) a plurality of facets formed on the first sidewall, each adapted to couple to a process chamber; and (3) an extended facet formed on the first sidewall that allows the mainframe to be coupled to at least four full-sized process chambers while providing service access to the mainframe. The second mainframe also includes a second transfer section coupled to the first transfer section and having (1) a second sidewall that defines a second central transfer region adapted to house a second robot; (2) a plurality of facets formed on the second sidewall, each adapted to couple to a process chamber; and (3) an extended facet formed on the second sidewall that allows the mainframe to be coupled to at least four full-sized process chambers while providing service access to the mainframe.

In a fourth aspect of the invention, a third mainframe is provided for use during semiconductor device manufacturing. The third mainframe includes (1) a sidewall that defines a central transfer region adapted to house a robot; (2) a plurality of facets formed on the sidewall, each adapted to couple to a process chamber; and (3) a spacer coupled to at least one of the facets, the spacer adapted to allow the mainframe to be coupled to at least four full-sized process chambers while providing service access to the mainframe. Numerous other aspects are provided in accordance with these and other aspects.

Other features and aspects of the present invention will become more fully apparent from the following detailed description, the appended claims and the accompanying drawings.

BRIEF DESCRIPTION OF THE DRAWINGS

FIG. 8A is a top plan view of an exemplary pass through chamber employing one or more spacers in accordance with the present invention.

FIG. 8B is a top plan view of an exemplary extended pass through chamber provided in accordance with the present invention.

FIG. 9 is a top plan view of an exemplary load lock chamber provided in accordance with the present invention.

DETAILED DESCRIPTION

The present invention relates to extended mainframe designs that allow additional and/or larger chambers to be placed around a mainframe while maintaining service access to the mainframe, as well as to the process chambers and/or load lock chambers coupled to the mainframe.

Figure 1:
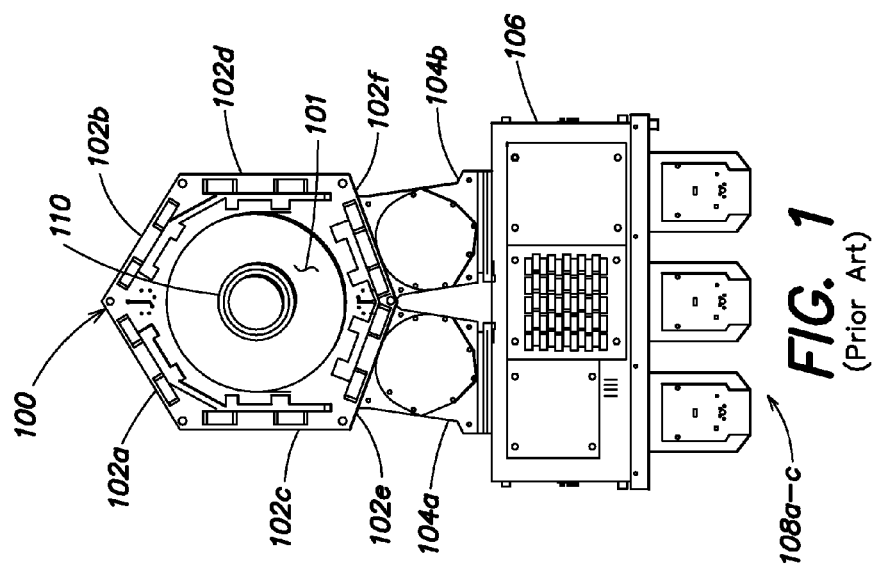
FIG. 1 is a top plan view of a conventional vacuum mainframe that may be employed during semiconductor device manufacturing.

FIG. 1 is a top plan view of a conventional vacuum mainframe 100 that may be employed during semiconductor device manufacturing. The vacuum mainframe 100 includes a central transfer chamber region 101 and a plurality of facets 102a-f each adapted to couple to a process chamber, load lock chamber, or other chamber (e.g., a preclean, bake-out, cool down, or metrology or defect detection chamber, or the like). While the mainframe 100 of FIG. 1 is shown as having six facets, it will be understood that fewer or more facets may be provided.

During a typical application, a plurality of load lock chambers 104a-b are coupled to the mainframe 100, such as at facets 102e, 102f as shown. A factory interface 106 may be coupled to the load lock chambers 104a-b and may receive substrate carriers 108a-c at load ports (not separately shown) of the factory interface 106. A factory interface robot (not separately shown) within the factory interface 106 thereafter may obtain substrates from the substrate carriers 108a-c and transfer the substrates to the load lock chambers 104a-b (or transfer substrates from the load lock chambers 104a-b to the substrate carriers 108a-c). A mainframe robot 110 may transfer substrates between the load lock chambers 104a-b and any process or other chambers coupled to the mainframe 100 (e.g., at facets 102a-d) during semiconductor device manufacturing.

Figure 2:
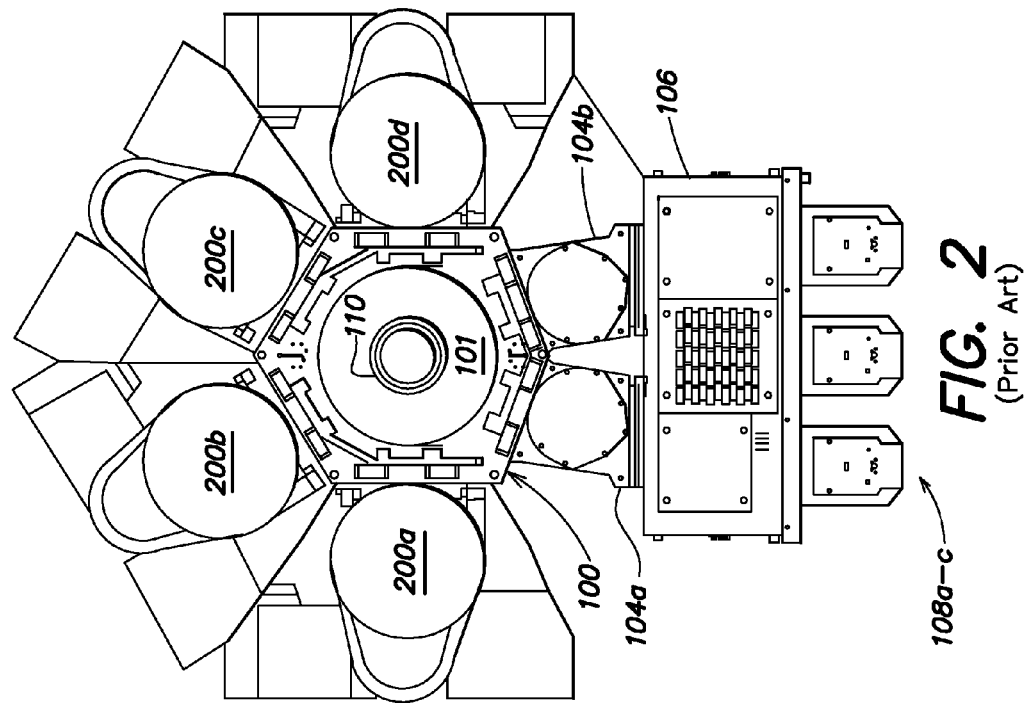
FIG. 2 is a top plan view of the mainframe of FIG. 1 showing four large chambers coupled to the mainframe.

FIG. 2 is a top plan view of the mainframe 100 of FIG. 1 showing four large chambers 200a-d coupled to the mainframe 100. With reference to FIGS. 1 and 2, in the conventional mainframe 100, a shorter reach is employed by the mainframe robot 110 for transferring substrates to and from the load lock chambers 104a, 104b than is used for transferring substrates to and from the process chambers 200a-d coupled to the mainframe 100 (as shown).

To increase clearance between the load lock chambers 104a-b and the process chambers 200a-d (e.g., for serviceability), the load lock chambers typically are rotated together (as shown). Nonetheless, serviceability issues may arise when large process chambers, such as etch chambers, chemical vapor deposition (CVD) chambers, atomic layer deposition (ALD) chambers, physical vapor deposition (PVD) chambers or the like, are employed with the mainframe 100. For example, when four large process chambers are coupled to the mainframe 100 as shown in FIG. 2, the mainframe 100 and/or the load lock chambers 104a-b may become unserviceable, or service access may be limited and/or unsafe (e.g., less than the 24" SEMI standard). Accordingly, only up to three large process chambers typically are employed with the mainframe 100.

Figure 3A:
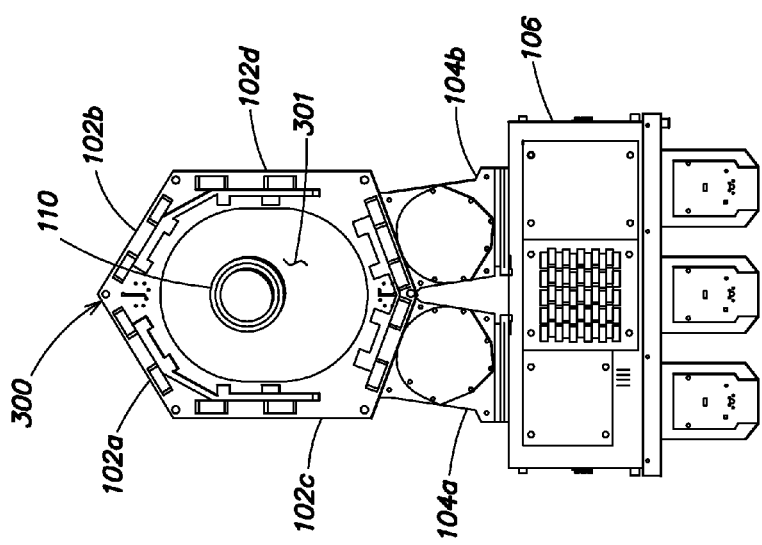
FIG. 3A is a top plan view of a first exemplary mainframe provided in accordance with the present invention.

FIG. 3A is a top plan view of a first exemplary mainframe 300 provided in accordance with the present invention. Compared to the conventional mainframe 100 of FIGS. 1 and 2, the mainframe 300 is "stretched" toward the factory interface 106 (as shown). The mainframe 300 may be stretched, for example, to the maximum reach of the mainframe robot 110 (or to any other suitable distance). In at least one embodiment, the mainframe 300 is stretched so that the extension of the mainframe robot 110 is increased by about 10 inches when transferring substrates to and from the load lock chambers 104a-b (compared to the extension of the mainframe robot 110 within the conventional mainframe 100). (As shown in FIG. 3A, the mainframe 300 is stretched by increasing the length of facets 102c, 102d formed in a sidewall of the mainframe 300, which may lead to a slight increase in the size of a central transfer region 301).

Figure 4:
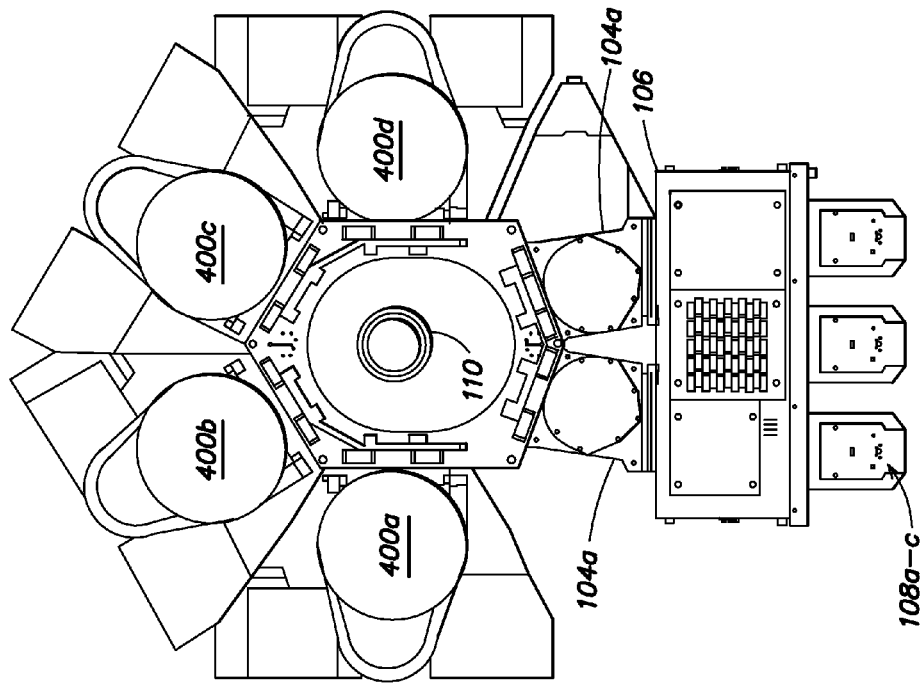
FIG. 4 is a top plan view of the first exemplary mainframe of FIG. 3A having four large process chambers coupled to the mainframe.

By stretching the mainframe 300, four large chambers may be installed around the mainframe 300 and still serviced safely. For example, FIG. 4 is a top plan view of the first exemplary mainframe 300 having four large process chambers 400a-d coupled to the mainframe 300. Service access is improved and safe, even when full-sized chambers are employed. Servicing may be performed, for example, between the process chambers coupled to facet 102c or 102d and the factory interface 106. In some embodiments, SEMI standard access requirements, such as 24" or greater of access, may be provided.

By stretching the mainframe 300 by an amount that does not exceed the reach constraints of the mainframe robot 110, no significant cost is incurred by modifying the mainframe 300. For example, the same mainframe robot 110, slit valves, load lock chambers, etc., used within the conventional mainframe 100 may be employed within the stretched mainframe 300.

Figure 3C:
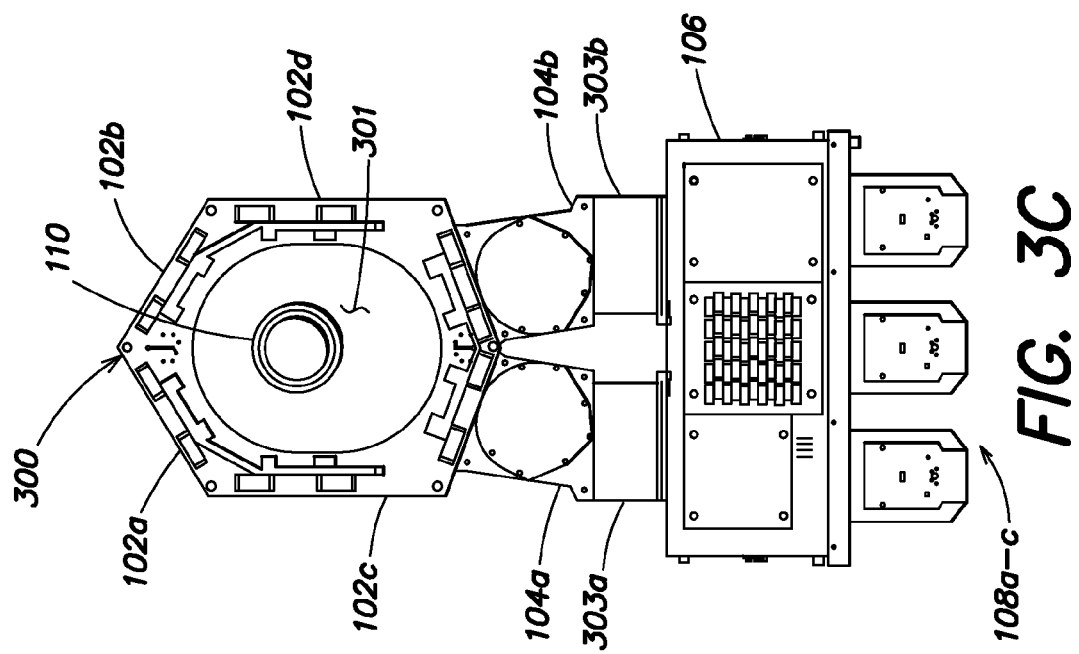
FIG. 3C is a top plan view of a second alternative embodiment of the mainframe of FIG. 3A provided in accordance with the present invention.
Figure 3B:
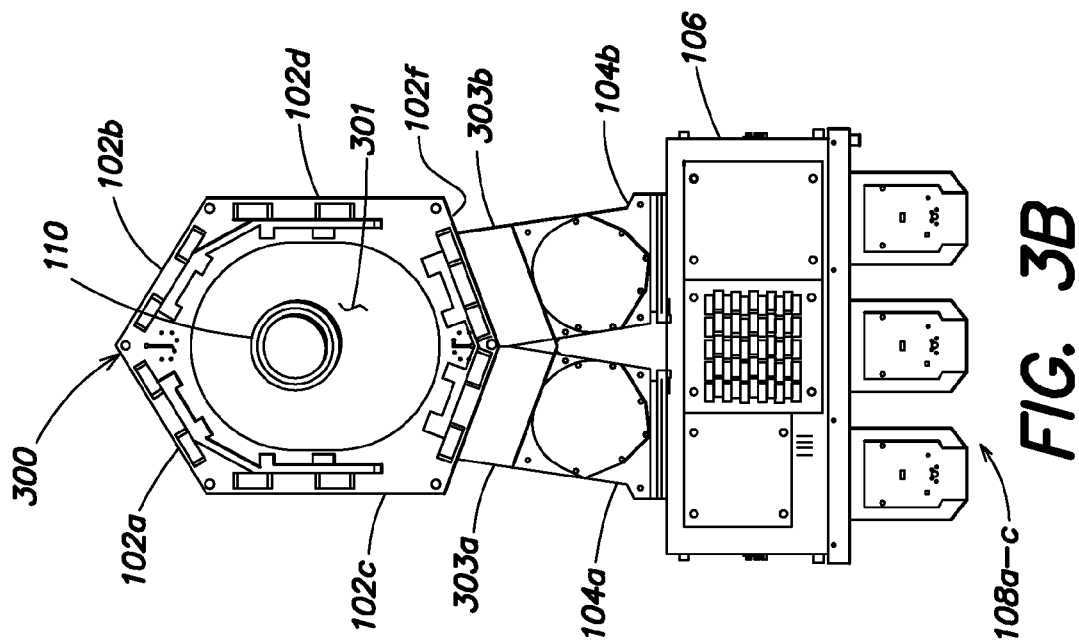
FIG. 3B is a top plan view of a first alternative embodiment of the mainframe of FIG. 3A provided in accordance with the present invention.

With reference to FIG. 3B, in addition or as an alternative, greater service access may be achieved by placing a spacer 303a between the facet 102e and the load lock chamber 104a and/or a spacer 303b between the facet 102f and the load lock chamber 104b so as to create additional space between the process chambers 400a and/or 400d and the factory interface 106 (FIG. 4). The spacers 303a-b may include, for example, tunnels or similar structures that extend between the mainframe 300 and the load lock chambers 104a and/or 104b. Similar spacers 303a-b may be used between the load lock chambers 104a and/or 104b and the factory interface 106 as shown in FIG. 3C (e.g., about a 6" to 8" length sheet metal or similar tunnel).

The length of the body of the load lock chamber 104a and/or 104b additionally or alternatively may be increased so as to create additional space between the process chambers 400a and/or 400d and the factory interface 106. The use of spacers and/or an extended load lock chamber body length may increase the distance between the mainframe 300 and the factory interface 106 and provide great service access.

Figure 5A:
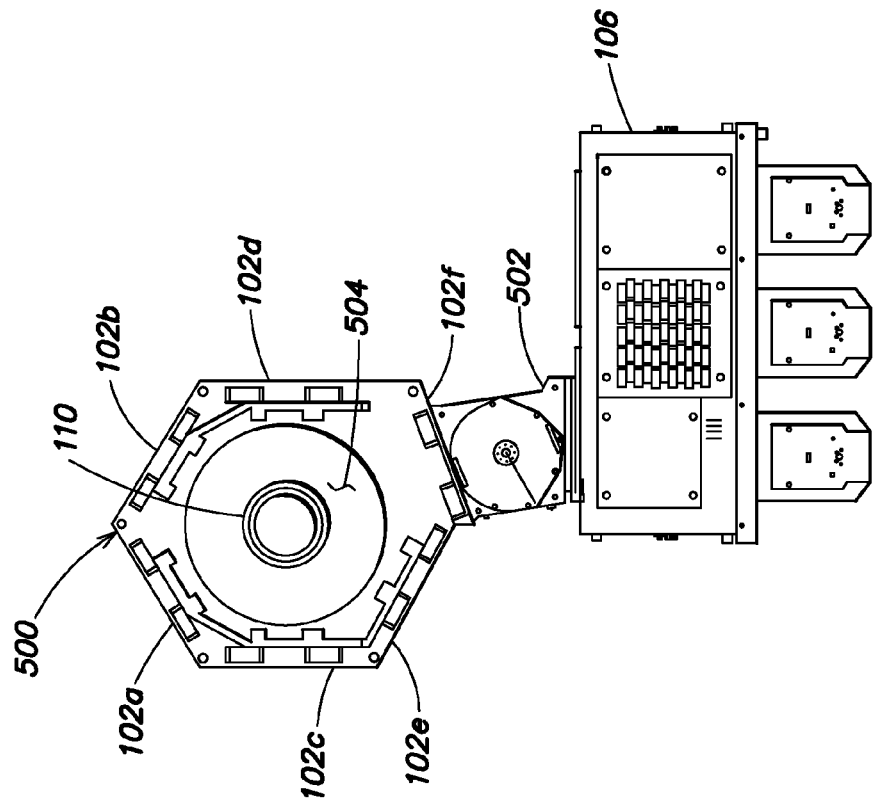
FIG. 5A is a top plan view of a second exemplary mainframe provided in accordance with the present invention.

FIG. 5A is a top plan view of a second exemplary mainframe 500 provided in accordance with the present invention. Compared to the conventional mainframe 100 of FIGS. 1 and 2, a single facet 102d of the mainframe 500 (formed in a sidewall of the mainframe) is "stretched" toward the factory interface 106 (as shown). The facet 102d of the mainframe 500 may be stretched, for example, to the maximum reach of the mainframe robot 110 (or to any other suitable distance). In at least one embodiment, the facet 102d of the mainframe 500 is stretched so that the extension of the mainframe robot 110 is increased by about 10 inches when transferring substrates to and from a single load lock chamber 502 employed with the mainframe 500 (compared to the extension of the mainframe robot 110 within the conventional mainframe 100). Note that a central transfer region 504 of the mainframe 500 is not significantly increased in size over that of the conventional mainframe 100.

Figure 6:
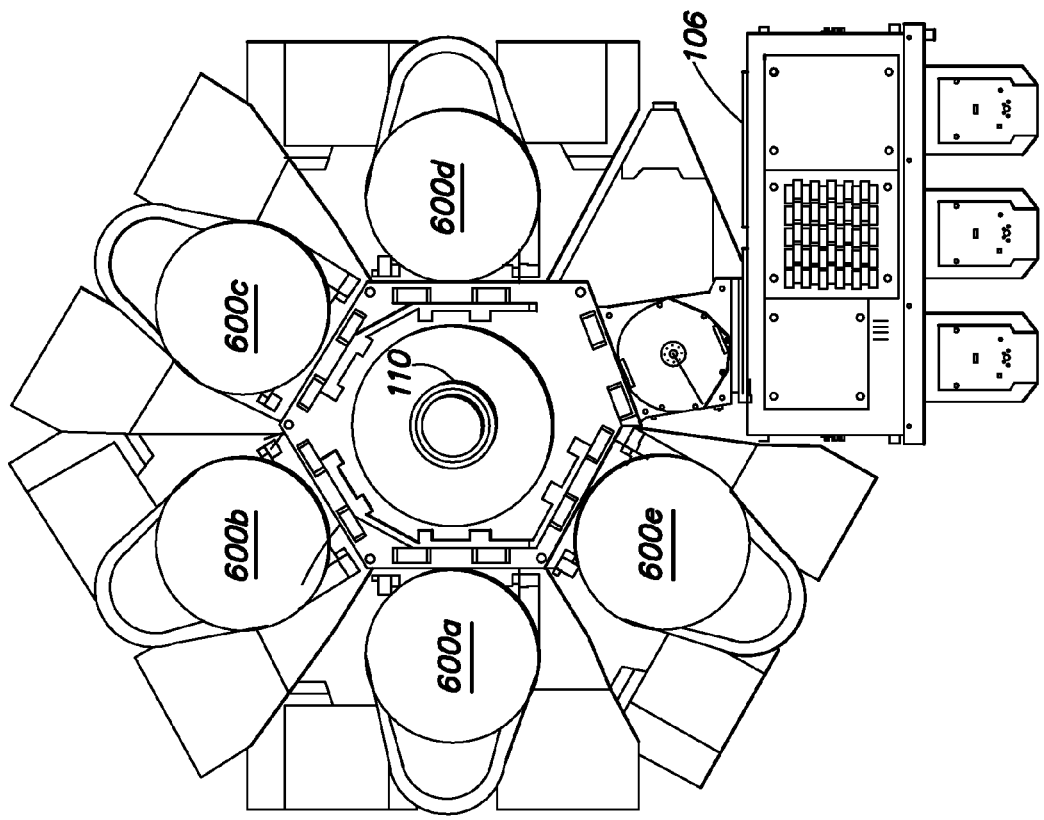
FIG. 6 is a top plan view of the second exemplary mainframe of FIG. 5A having five large process chambers coupled to the mainframe.

By stretching only the facet 102d of the mainframe 500, five large chambers may be installed around the mainframe 500 and still serviced safely. For example, FIG. 6 is a top plan view of the second exemplary mainframe 500 having five large process chambers 600a-e coupled to the mainframe 500. Service access is improved and safe, even when full-sized chambers are employed. Servicing may be performed, for example, between the process chamber coupled to facet 102d and the factory interface 106. In some embodiments, SEMI standard access requirements, such as 24" or greater of access, may be provided.

Note that the facet 102c alternatively may be stretched while the facet 102d remains unstretched. In such an embodiment, the load lock chamber 502 is coupled to the facet 102e and servicing may be performed, for example, between the process chamber coupled to facet 102c and the factory interface 106.

By stretching a single facet of the mainframe 500 by an amount that does not exceed the reach constraints of the mainframe robot 110, no significant cost is incurred by modifying the mainframe 500. For example, the same mainframe robot 110, slit valves, load lock chambers, etc., used within the conventional mainframe 100 may be employed within the stretched mainframe 500.

As shown in FIG. 5A, the load lock chamber 502 is rotated in a manner similar to the load lock chambers 104a-b of FIG. 3A (e.g., by about 5 to 10 degrees, although other degrees of rotation may be used). The mainframe 500 of FIG. 5A may be serviced even when five large (full-size) chambers are coupled to the mainframe 500. The combination of a stretched mainframe and load lock chamber rotation increases serviceability.

As a further example, when all chambers are operated in parallel (e.g., perform the same process), the use of five chamber facets is 25% more productive than the use of four chamber facets. For a sequential process sequence, additional throughput improvement may be realized. For example, a typical metal etch process employs two etch chambers and two strip chambers. Each etch chamber generally has about two-thirds (⅔) of the throughput of a strip chamber (e.g., 20 wafers/hour for etch versus 30 wafers/hour for strip). By employing all five facets, an additional etch chamber may be coupled to the mainframe 500 so that three etch chambers and two strip chambers are present. The use of three etch chambers and two strip chambers leads to a 50% throughput improvement when compared to the use of two etch chambers and two strip chambers in other mainframe configurations.

Figure 5C:
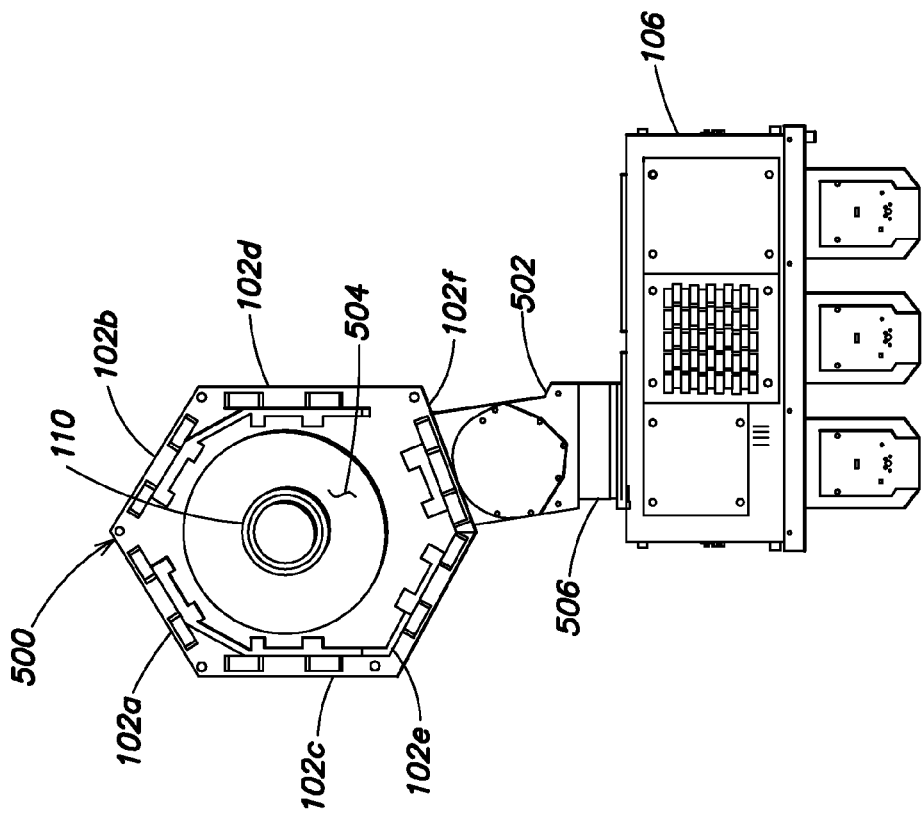
FIG. 5C is a top plan view of a second alternative embodiment of the mainframe of FIG. 5A provided in accordance with the present invention.
Figure 5B:
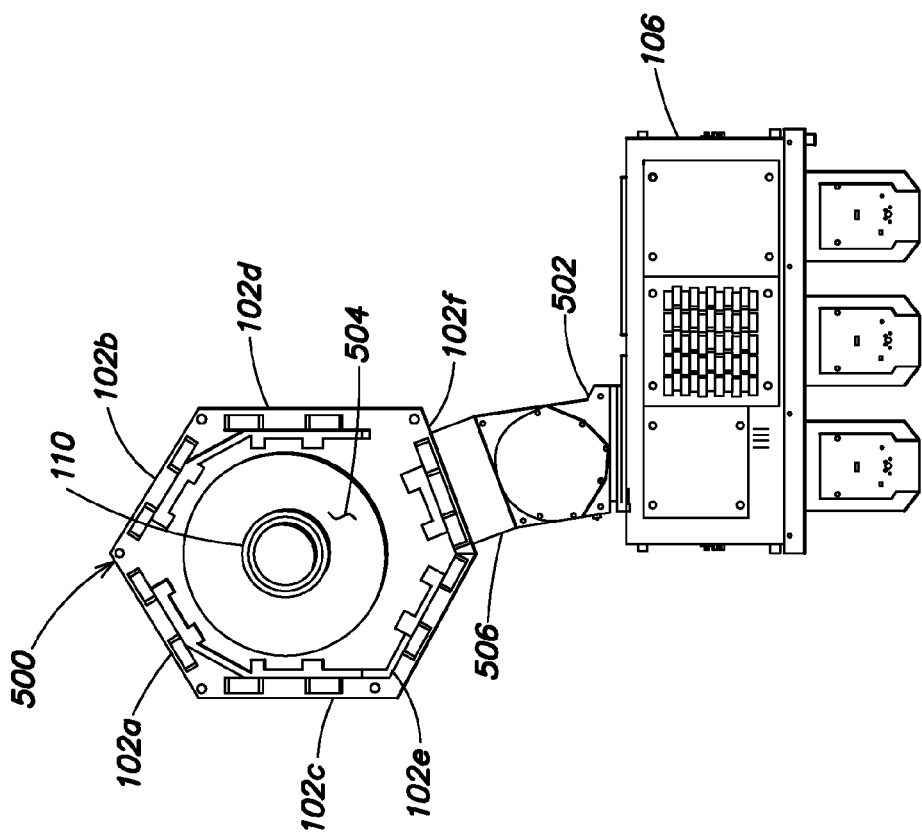
FIG. 5B is a top plan view of a first alternative embodiment of the mainframe of FIG. 5A provided in accordance with the present invention.

In addition or as an alternative, greater service access may be achieved by placing a spacer 506 between the facet 102f and the load lock chamber 502 so as to create additional space between the process chamber 600d and the factory interface 106 (FIG. 6). The spacer 506 may include, for example, a tunnel or similar structure that extends between the mainframe 500 and the load lock chamber 502. A similar spacer may be used between the load lock chamber 502 and the factory interface 106 as shown in FIG. 5C (e.g., about a 6" to 8" length sheet metal or similar tunnel).

The length of the body of the load lock chamber 502 additionally or alternatively may be increased so as to create additional space between the process chamber 600d and the factory interface 106. The use of spacers and/or an extended load lock chamber body length may increase the distance between the mainframe 500 and the factory interface 106 and provide great service access.

Figure 7A:
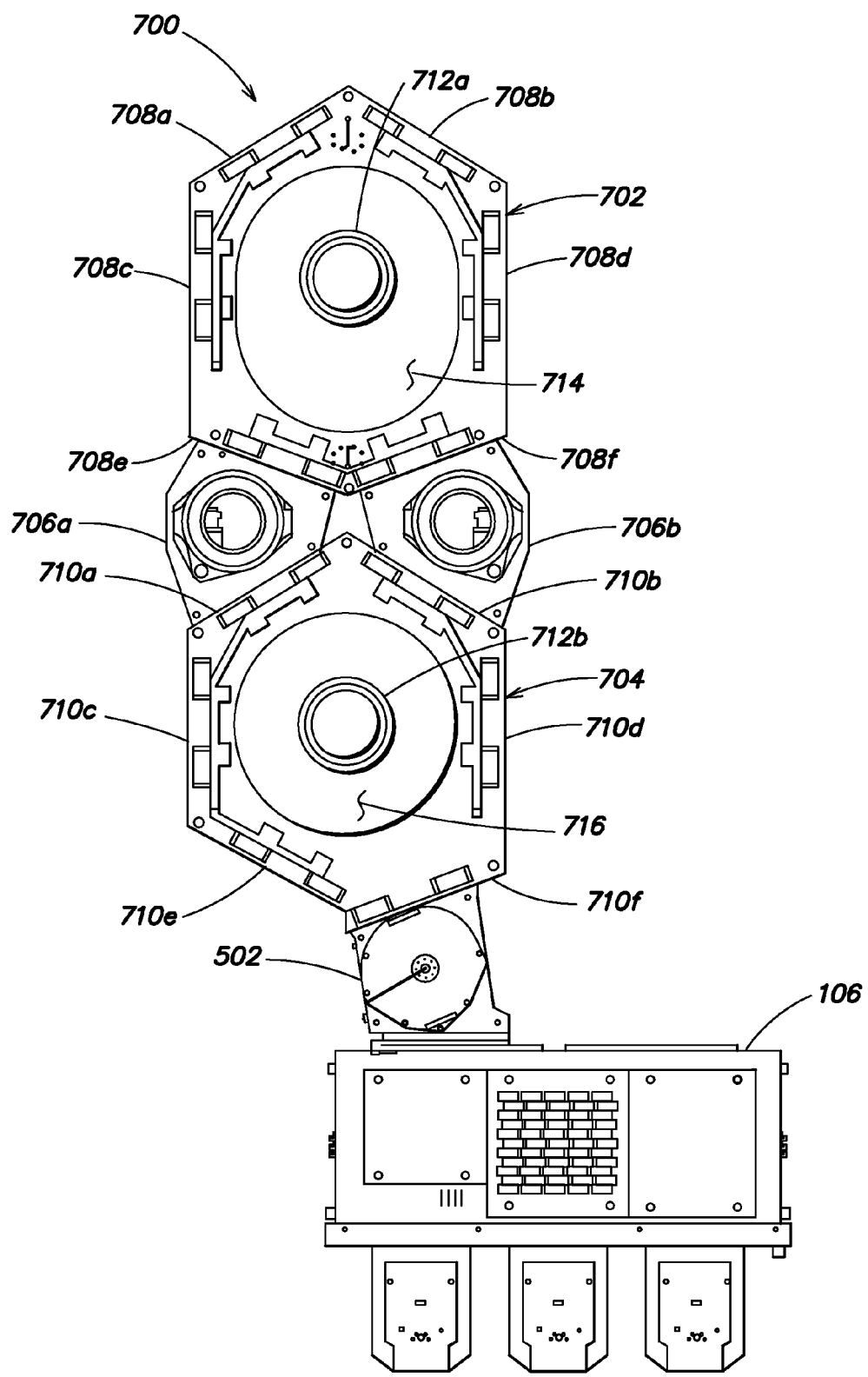
FIG. 7A is a top plan view of a third exemplary mainframe provided in accordance with the present invention.

FIG. 7A is a top plan view of a third exemplary mainframe 700 provided in accordance with the present invention. The third mainframe 700 includes a first mainframe section 702 (e.g., a high vacuum section) coupled to a second mainframe section 704 (e.g., a lower vacuum, input section). The first and second mainframe sections 702, 704 are coupled via pass through chambers 706a-706b. The first mainframe section 702 includes facets 708a-f (formed in a first sidewall of the mainframe) and the second mainframe section 704 includes facets 710a-f (formed in a second sidewall of the mainframe). Each mainframe section 702, 704 includes a mainframe robot 712a, 712b.

As shown in FIG. 7A, the first mainframe section 702 is similar to the mainframe 300 of FIGS. 3A-C and 4. That is, the facets 708c and 708d of the first mainframe section 702 are "stretched" toward the factory interface 106 (as shown). The facets 708c, 708d of the first mainframe section 702 may be stretched, for example, to the maximum reach of the first mainframe robot 712a (or to any other suitable distance). In at least one embodiment, the facets 708c, 708d of the first mainframe section 702 are stretched so that the reach of the first mainframe robot 712a is increased by about 10 inches when transferring substrates to and from the pass through chambers 706a, 706b (compared to the reach of a mainframe robot within a conventional mainframe). By stretching the first mainframe section 702 as described, four large chambers may be installed around the first mainframe section 702 and still serviced safely.

In the second mainframe section 704, a single facet 710d of the mainframe section 704 is "stretched" toward the factory interface 106 (as shown). The facet 710d of the second mainframe section 704 may be stretched, for example, to the maximum reach of the second mainframe robot 712b (or to any other suitable distance). In at least one embodiment, the facet 710d of the second mainframe section 704 is stretched so that the extension of the mainframe robot 712b is increased by about 10 inches when transferring substrates to and from a single load lock chamber 502 employed with the mainframe 700 (compared to the extension of a mainframe robot within a conventional mainframe). By stretching only the facet 710d of the second mainframe section 704, five large chambers may be installed around the second mainframe section 704 and still serviced safely.

Through use of the stretched mainframe sections 702, 704, the mainframe 700 may provide a total of seven facets for large, full-sized chambers. A central transfer region 714 of the first mainframe section 702 is slightly larger than a central transfer region 716 of the second mainframe section 704.

Figure 7B:
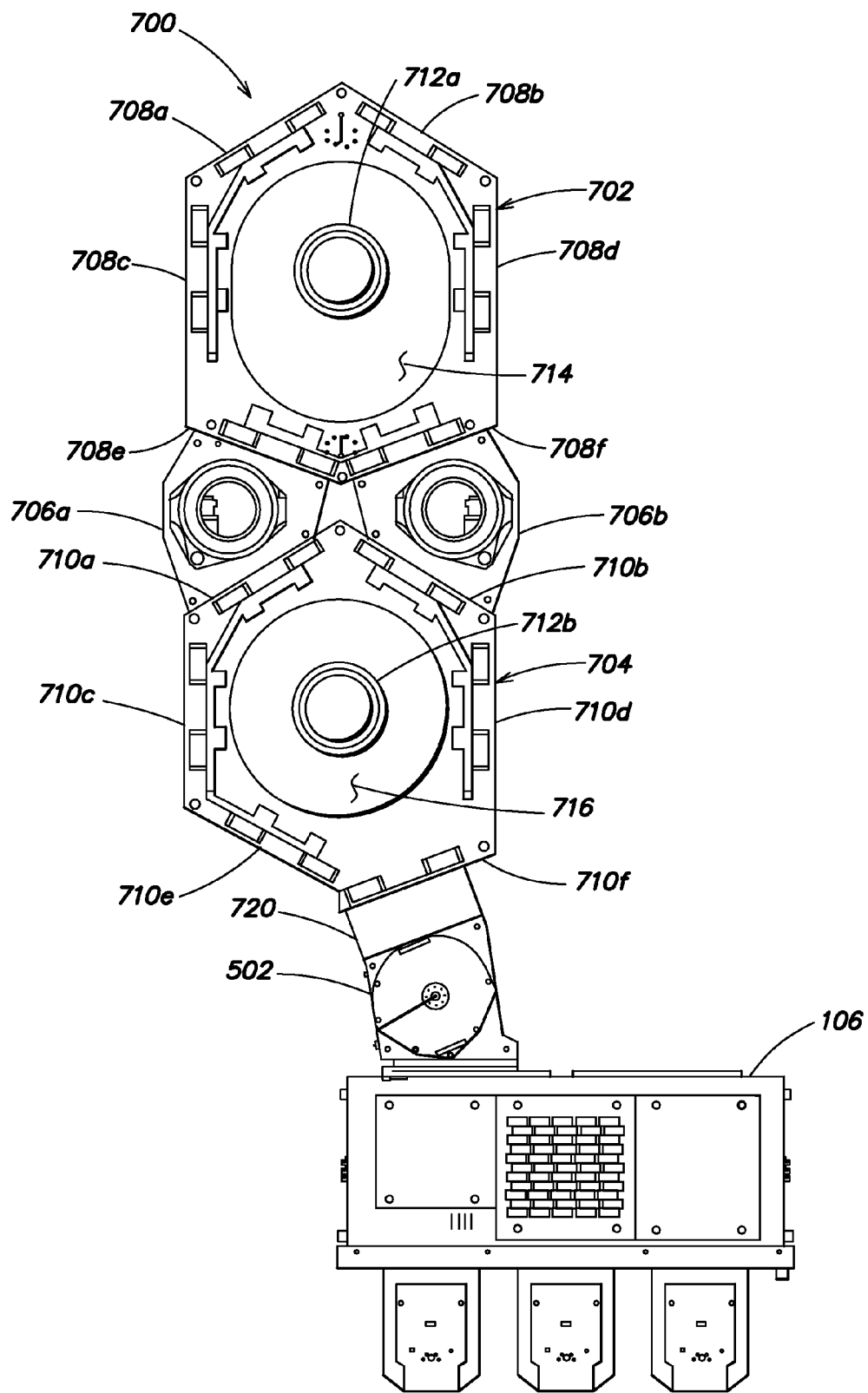
FIG. 7B is a top plan view of a first alternative embodiment of the mainframe of FIG. 7A provided in accordance with the present invention.
Figure 7C:
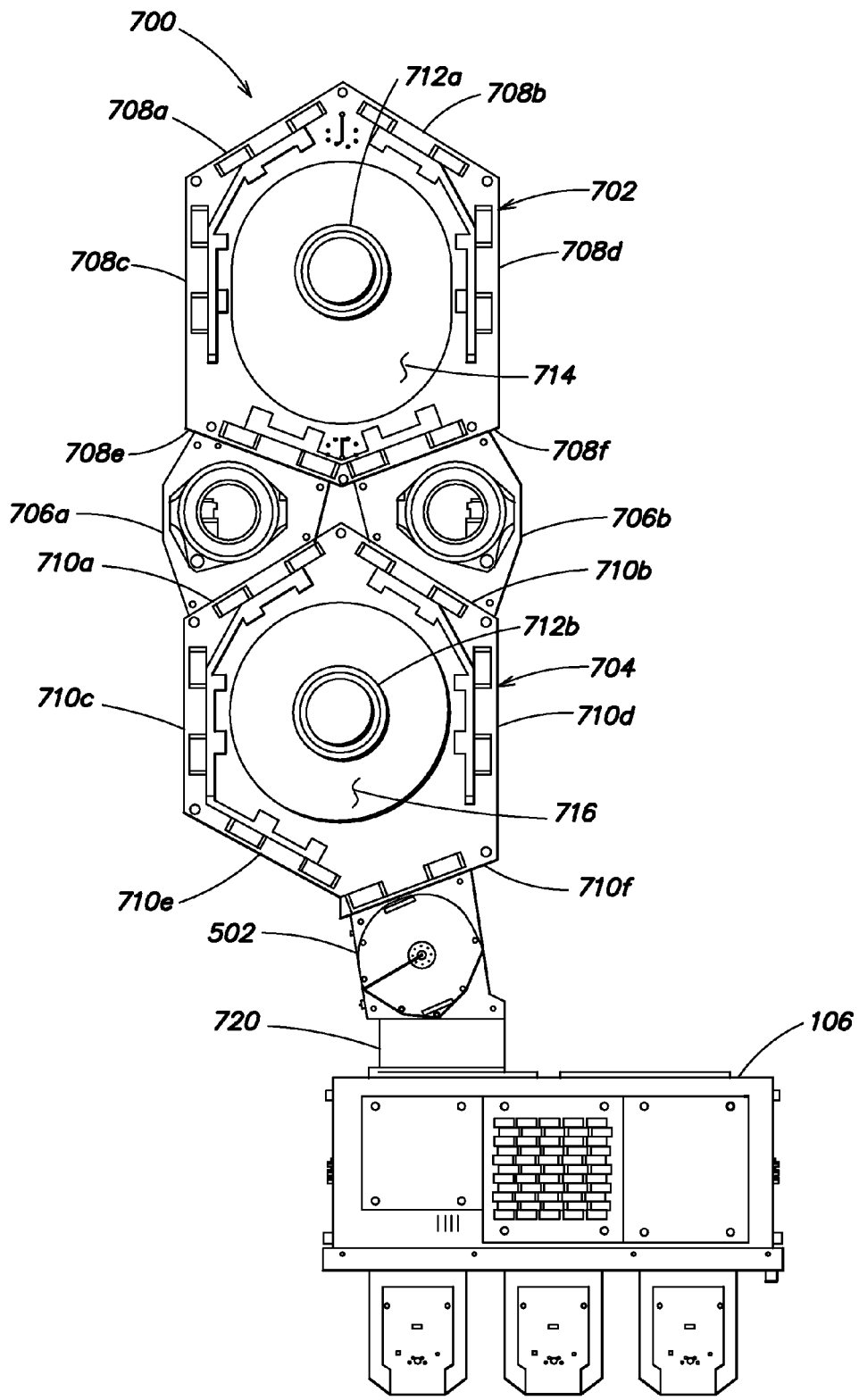
FIG. 7C is a top plan view of a second alternative embodiment of the mainframe of FIG. 7A provided in accordance with the present invention.

In addition or as an alternative, greater service access may be achieved by placing a spacer 720 (FIG. 7B) between the facet 710f and the load lock chamber 502 so as to create additional space between any process chamber coupled to facet 710d and the factory interface 106. The spacer 720 may include, for example, a tunnel or similar structure that extends between the second mainframe section 704 and the load lock chamber 502. A similar spacer 720 may be used between the load lock chamber 502 and the factory interface 106 as shown in FIG. 7C (e.g., about a 6" to 8" length sheet metal or similar tunnel).

In addition or as an alternative, greater service access may be achieved by placing a spacer between the facet 708e and the pass through chamber 706a and/or a spacer between the facet 708f and the pass through chamber 706b so as to create additional space between the pass through chambers 706a, 706b and process chambers coupled to facets 708c, 708d (FIG. 7A). The spacers may include, for example, tunnels or similar structures that extend between the first mainframe section 702 and the pass through chambers 706a, 706b. Spacers also may be used between the pass through chambers 706a, 706b and the second mainframe section 704.

FIG. 8A is a top plan view of an exemplary embodiment of the first pass through chamber 706a having a first spacer 802a and a second spacer 802b coupled thereto in accordance with the present invention. The second pass through chamber 706b may be similarly configured.

The length of the body of the pass through chambers 706a and/or 706b additionally or alternatively may be increased. For example, FIG. 8B is an exemplary embodiment of the second pass through chamber 706b having a body region 804 extended in accordance with the present invention. Other body portions may be extended. The first pass through chamber 706a may be similarly configured.

The length of the body of the load lock chamber 502 additionally or alternatively may be increased so as to create additional space between any process chamber coupled to facet 710d and the factory interface 106. For example, FIG. 9 illustrates an exemplary embodiment of the load lock chamber 502 having a body region 902 extended in accordance with the present invention. Other body portions may be extended. The load lock chambers 104a-b may be similarly extended. The use of spacers and/or an extended load lock chamber body length may increase the distance between the mainframe 700 (or 500) and the factory interface 106 and provide great service access.

The foregoing description discloses only exemplary embodiments of the invention. Modifications of the above disclosed apparatus and methods which fall within the scope of the invention will be readily apparent to those of ordinary skill in the art. For instance, the mainframes 300, 500 and/or the mainframe sections 702, 704 may include more or fewer than six facets. Accordingly, while the present invention has been disclosed in connection with exemplary embodiments thereof, it should be understood that other embodiments may fall within the spirit and scope of the invention, as defined by the following claims.

The invention claimed is:

1. A mainframe for use during semiconductor device manufacturing comprising:
   a sidewall that defines a central transfer region adapted to house a robot;
   a plurality of facets formed on the sidewall, each adapted to couple to a process chamber; and
   a single extended facet formed on the sidewall that allows the mainframe to be coupled to full-sized process chambers while providing service access to the mainframe, wherein the single extended facet has a length longer than the plurality of facets which are adapted to couple to process chambers and that are not extended and the single extended facet extends towards a facet adapted to couple to a load lock chamber.

2. The mainframe of claim 1 wherein the single extended facet is adapted to increase a distance between a load lock chamber coupled to the mainframe and a process chamber coupled to the single extended facet.

3. The mainframe of claim 2 wherein the robot transfers substrates to and from the load lock chamber at approximately a maximum reach of the robot.

4. The mainframe of claim 1 wherein the mainframe is adapted to couple to at least four full-sized process chambers while providing service access to the mainframe and any load lock chamber coupled to the mainframe.

5. The mainframe of claim 1 wherein the mainframe is adapted to couple to five full-sized process chambers while providing service access to the mainframe and any load lock chamber coupled to the mainframe.

6. A system for use during semiconductor device manufacturing comprising:
   a mainframe having:
      a sidewall that defines a central transfer region adapted to house a robot;
      a plurality of facets formed on the sidewall, each adapted to couple to a process chamber; and
      a single extended facet formed on the sidewall that allows the mainframe to be coupled to full-sized process chambers while providing service access to the mainframe;
   a robot positioned within the central transfer region of the mainframe;
   a load lock chamber coupled to a facet; and
   a process chamber coupled to the single extended facet;
   wherein the single extended facet is adapted to increase a distance between the load lock chamber coupled to the mainframe and the process chamber coupled to the single extended facet, and wherein the single extended facet has a length longer than the plurality of facets which are adapted to couple to process chambers and that are not extended and the single extended facet extends towards the facet coupled to the load lock chamber.

7. The system of claim 6 wherein the robot transfers substrates to and from the load lock chamber at approximately a maximum reach of the robot.

8. The system of claim 6 wherein the mainframe is adapted to couple to at least four full-sized process chambers while providing service access to the mainframe and any load lock chamber coupled to the mainframe.

9. The system of claim 6 wherein the mainframe is adapted to couple to five full-sized process chambers while providing service access to the mainframe and any load lock chamber coupled to the mainframe.

10. A mainframe for use during semiconductor device manufacturing comprising:
    a first mainframe section having:
       a first sidewall that defines a first central transfer region adapted to house a first mainframe robot;
       a plurality of facets formed on the first sidewall, each adapted to couple to a process chamber; and
       an extended facet formed on the first sidewall that allows the mainframe to be coupled to full-sized process chambers while providing service access to the mainframe; and
    a second mainframe section coupled to the first mainframe section having:
       a second sidewall that defines a second central transfer region adapted to house a second mainframe robot;
       a plurality of facets formed on the second sidewall, each adapted to couple to a process chamber; and
       an extended facet formed on the second sidewall that allows the mainframe to be coupled to full-sized process chambers while providing service access to the mainframe, and wherein the extended facets have a length longer than the plurality of facets that are not extended.

11. The mainframe of claim 10 wherein the extended facet of the first mainframe section is adapted to increase a distance between a pass through chamber coupled between the first mainframe section and the second mainframe section and a process chamber coupled to the extended facet.

12. The mainframe of claim 11 wherein the first mainframe robot transfers substrates to and from the pass through chamber at approximately a maximum reach of the first mainframe robot.

13. The mainframe of claim 10 wherein the extended facet of the second mainframe section is adapted to increase a distance between a load lock chamber coupled to the second mainframe section and a process chamber coupled to the extended facet.

14. The mainframe of claim 13 wherein the second mainframe robot transfers substrates to and from the load lock chamber at approximately a maximum reach of the second mainframe robot.

15. The mainframe of claim 10 wherein the first mainframe section of the mainframe is adapted to couple to at least four full-sized process chambers while providing service access to the first mainframe section of the mainframe.

16. The mainframe of claim 10 wherein the second mainframe section of the mainframe is adapted to couple to at least three full-sized process chambers while providing service access to the second mainframe section of the mainframe.

17. The mainframe of claim 10 wherein the first mainframe section of the mainframe includes a plurality of extended facets.

18. A mainframe for use during semiconductor device manufacturing comprising:
   a sidewall that defines a central transfer region adapted to house a robot;
   a plurality of facets formed on the sidewall, each adapted to couple to a process chamber, at least one of the plurality of facets comprising an extended facet; and
   a spacer coupled to at least one of the facets, the spacer adapted to couple to one of a load lock chamber and a pass through chamber and allow the mainframe to be coupled to at least four full-sized process chambers while providing service access to the mainframe, and wherein the extended facet has a length longer than the plurality of facets that are not extended.

19. The mainframe of claim 18 wherein the spacer is adapted to couple a load lock chamber to the mainframe.

20. The mainframe of claim 18 wherein the spacer is adapted to couple a pass through chamber to the mainframe wherein the pass through chamber is adapted to couple to another mainframe section.

21. The mainframe of claim 18 wherein the spacer is adapted to allow the mainframe to be coupled to at least five full-sized process chambers while providing service access to the mainframe.

22. A system adapted for semiconductor device manufacturing comprising:
   a mainframe having:
      a sidewall that defines a central transfer region;
      a plurality of facets formed on the sidewall which are coupled to process chambers wherein a single one of the plurality of facets is an extended facet that allows the mainframe to be coupled to five full-sized process chambers;
   a mainframe robot positioned within the central transfer region of the mainframe;
   a single load lock chamber coupled to another facet of the mainframe; and
   wherein the single extended facet is adapted to increase a distance between the load lock chamber and a process chamber coupled to the single extended facet, and wherein the single extended facet has a length longer than the plurality of facets that are not extended.

* * * * *